United States Patent [19]

Mueller et al.

[11] Patent Number: 5,106,720
[45] Date of Patent: Apr. 21, 1992

[54] BASE DEVELOPABLE NEGATIVE ACTING PHOTORESISTS

[75] Inventors: Werner H. Mueller, Corpus Christi, Tex.; Dinesh N. Khanna, West Warwick, R.I.

[73] Assignee: Hoechst Celanese Corporation, Somerville, N.J.

[21] Appl. No.: 405,493

[22] Filed: Sep. 11, 1989

Related U.S. Application Data

[63] Continuation-in-part of Ser. No. 76,098, Jul. 21, 1987, Pat. No. 4,927,736, and a continuation-in-part of Ser. No. 915,342, Oct. 2, 1986, abandoned.

[51] Int. Cl.⁵ .............................. G03F 7/037
[52] U.S. Cl. .................... 430/285; 430/281; 430/288; 430/906; 522/142

[58] Field of Search ............... 430/906, 288, 281, 285; 522/142

[56] References Cited

U.S. PATENT DOCUMENTS 4,572,887 2/1986 Geissler ................ 430/288

Primary Examiner—Cynthia Hamilton

[57] ABSTRACT

A base developable negative acting photoresist composition which is thermally stable, provides high resolution at short exposure times and is capable of development by means of conventional aqueous alkaline developers. The present compositions comprise an alkali soluble hydroxylated polyamide and/or polyimide binder material, a photopolymerizable compound containing at least two ethylenically-unsaturated double bonds, and a light-sensitive photoinitiator.

10 Claims, No Drawings

BASE DEVELOPABLE NEGATIVE ACTING PHOTORESISTS

BACKGROUND OF THE INVENTION

This is a continuation-in-part of applications Ser. No. 76,098 filed Jul. 21, 1987 now U.S. Pat. No. 4,927,736 and Ser. No. 915,342 filed Oct. 2, 1986 now abandoned.

The present invention relates to negative-acting photoresist compositions based upon soluble hydroxy-containing resin binder materials, which compositions are developable by means of conventional alkaline developer solutions, provide high resolution at relatively short exposure times and most preferably are thermally stable at relatively high temperatures.

Applications Ser. No. 76,098 and Ser. No. 915,342 relate to the production of novel soluble hydroxy polyimide and hydroxy polyamide resin binder materials and their use in making base-developable positive acting photoresists for high temperature applications. The present invention relates to the use of the soluble hydroxy polyimide and hydroxy polyamide resin binder precursors disclosed in said applications to produce photoresist compositions which are negative acting and base developable.

Generally, positive-acting photoresist compositions have been preferred. They are soluble in common organic solvents and can be developed in conventional alkaline developers. This solubility is preserved in the positive photoresist process in which the exposed, uncoupled areas of the photoresist coating retain their original solubility while the unexposed masked areas are coupled with the azo photoinitiator to a condition in which they are rendered insoluble in alkaline developers. Reference is made to U.S. Pat. Nos. 4,093,461; 4,339,521 and 4,395,482 for their disclosure of such positive-acting photoresist compositions.

It is desirable to provide negative acting photoresist compositions which are temperature stable and provide high resolution at low exposure times, in the same manner as known positive acting photoresist compositions, and are also developable by means of conventional alkaline developers. High temperature-resistant negative-acting photoresist compositions are known but such compositions generally are not soluble in or developable by conventional alkaline developers, and therefore require the use of organic solvents such as dimethyl formamide and butyrolactone as developers. Reference is made to U.S. Pat. Nos. 3,957,512; 4,045,223 and Re. 30,186 for their disclosure of such negative-acting photoresist compositions.

In the industrial application of positive and negative resists, the polymeric component and the radiation sensitizer are dissolved in an organic solvent or mixture of solvents and applied as a thin film or coating to a substrate suitable for the desired application.

The polymeric component of these resist formulations is desirably soluble in aqueous alkaline solutions, but the sensitizer acts as a dissolution rate inhibitor with respect to the polymer. Upon exposure of selected areas of the coated substrate to actinic radiation, the sensitizer undergoes a radiation induced structural transformation and the exposed areas of the coating generally are rendered more soluble than the unexposed areas. This difference in solubility rates normally causes the exposed areas of the resist coating to be dissolved when the substrate is immersed in alkaline developing solution leaving the unexposed areas substantially intact, thus producing a positive relief pattern on the substrate.

In most applications, the exposed and developed substrate will be subjected to treatment by a substrate-etchant solution. The resist coating protects the coated areas of the substrate from the etchant and thus the etchant is only able to etch the uncoated areas of the substrate, which in the case of a positive resist, corresponds to the areas that were exposed to actinic radiation, and in the case of a negative resist, corresponds to the areas that were masked and not exposed to actinic radiation. Thus, an etched pattern can be created on the substrate which is a positive or a negative of the pattern of the mask, stencil, template, etc., that was used to create selective exposure patterns on the coated substrate prior to development.

The relief pattern of resist on the substrate produced by the methods described above is useful for various applications including, for example, as an exposure mask or a pattern such as is employed in the manufacture of miniaturized integrated electronic components or the manufacture of a printing plate.

The properties of a resist composition which are important in commercial practice include the solubility of the resist in the application solvent, the photospeed of the resist, development contrast, environmentally acceptable developer solubility, resist resolution, resist adhesion, dimensional stability at elevated temperature and abrasion resistance.

Photospeed is important for a resist, particularly in applications where a number of exposures are needed, for example, in generating multiple patterns by a repeated process, or where light of reduced intensity is employed such as in projection exposure techniques where the light is passed through a series of lenses and mono-chromatic filters. Thus, high, controlled photospeed is particularly important for a resist composition employed in processes where a number of multiple exposures must be made to produce a mask or series of circuit patterns on a substrate. Control of the photospeed is extremely important in order to produce high resolution relief patterns in microcircuitry; e.g., a photospeed too high can result in narrowing the processing conditions.

Resist resolution refers to the capability of a resist system to reproduce the smallest equally spaced line pairs and intervening spaces of a mask which is utilized during exposure with a high degree of image edge acuity in the developed exposed spaces. In many industrial applications, particularly in the manufacture of miniaturized electronic components, a resist is required to provide a high degree of resolution for very small line and space widths (on the order of a micron or so).

The ability of a resist to reproduce very small dimensions, on the order of a micron or so, is extremely important in the production of large scale integrated circuits on silicon chips and similar components. Circuit density on such a chip can be increased, assuming photolithography techniques are utilized, by increasing the resolution capabilities of the resist.

Various attempts have been made in the prior art to produce high temperature positive resists possessing the above desired properties. For example, U.S. Pat. No. 4,093,461 discloses a heat resistant, positive resistant composition comprising a quinone or naphthoquinone diazide and the polycondensation product of an aromatic dianhydride (pryomellitic anhydride) and an aromatic diamine (4,4,-diaminodiphenylether). The properties of the positive resist of the patent are discussed in U.S. Pat. No. 4,395,482 (column 1, lines 46–64). There it is pointed out that the positive resist composition of U.S. Pat. No. 4,093,461 has limited storage life, insufficient stability to alkaline etching solutions and relatively small differences in solubility between the exposed and unexposed portion of the resist.

The use of imagable polyimide and polyamide resist systems has been limited by the lack of photospeed (slow photospeed), excessive volume contraction and by shelf life problems. The exceptional dielectric and high temperature resistance properties of polyimides make them particularly useful in the semiconductor industry. They can be used, for example, as dielectric layers, alpha particle barriers in memory devices, ion implantation masks and passivation layers. The goal of numerous development programs has been the development of a simple, reliable and cost effective radiation sensitive polyimide system that could be used with common photolithographic equipment and processes. This was the goal of by the work of R. Rubner et al. of Siemens Co. (R. Rubner, H. Ahne, E. Kuhn, G. Kolodziej; Phot. Sci. 4 Eng. 23(5), 303–309 (1979). H. Ahne, H. Kruger, E. Pammer and R. Rubner, "Polyimide Synthesis, Characterization and Application", K. L. Mittal ed., Vol. 2, 905–918, Plenum Press (1984). The basic systems in these publications consist of polyamic acid polymer bearing photoreactive side groups. To date, however, materials based on this chemistry have been plagued by poor shelf life, extraordinarily low photospeed and excessive post-development/post-cure structure contraction. Although materials based on this chemistry have yielded high resolution structures, they required exposures of ten minutes or longer. Shelf life was also notoriously short, particularly in highly concentrated solutions required for thick film applications and contraction of original structures upon cure was as much as 60 percent.

The present invention uses the novel fluorinated hydroxy polyimides and fluorinated hydroxy polyamides of the parent applications as a binder material to provide negative photoresist compositions e.g., an alkali soluble hydroxy polyimide or hydroxy polyamide together with a photopolymerizable multifunctional acrylate and photoinitiator to provide high temperature negative photoresist protective coatings for producing negative patterns with excellent resolution and adhesion properties.

SUMMARY OF THE INVENTION

The present invention is based upon the discovery that the novel alkali-soluble fluorinated hydroxy-containing polyimides and polyamides of the aforementioned copending applications can be used in association with photopolymerizable compounds having at least two ethylenically-unsaturated double bonds, such as di- or tri-acrylate (including methacrylate) monomers (including telomers), and a light sensitive polymerization starter or photoinitiator, to produce negative acting photoresist compositions having the beneficial properties of the photoresist compositions based upon these hydroxy-containing resin binder materials and which are developable by means of alkaline developers.

The novel hydroxy polyimides useful according the the present invention are typically prepared by the solution condensation of hexafluoro-2,2-bis-(3-amino-4-hydroxyphenyl) propane with a dianhydride such as 5,5'-[2,2,2-trifluoro-1-(trifluoromethyl)ethylidene]bis-1,3-isobenzofurandione, benzophenone tetracarboxylic dianhydride (BTDA), and oxydiphthalic dianhydride (ODPA), as disclosed more completely in copending application Ser. No. 76,098, the disclosure which is hereby incorporated by reference. A portion of the hexafluoro-2,2-bis-(3-amino-4-hydroxy-phenyl) propane may be replaced with another diamine comonomer optionally containing fewer hydroxy substituents in order to reduce the solubility of the polymer in alkaline aqueous resist developer. Alternatively, the developer solubility of the polyimide can be reduced by neutralizing the solubilizing effect of the hydroxy groups in the preformed polymer by converting them to a less developer-soluble moiety; for example, by acylating a portion of the hydroxy groups in the preformed polymer. The use of non-hydroxy comonomers or post-polymerization neutralization of the hydroxy groups provides another method of controlling the resist's photospeed.

Such polyimides preferably have the general structure (1):

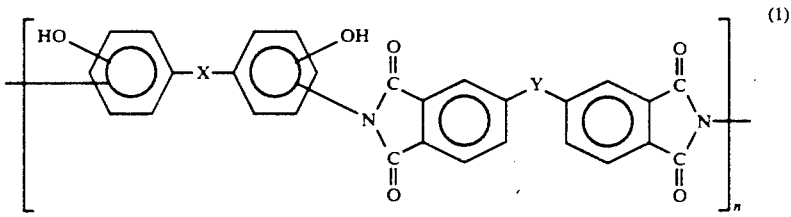

where "X" and "Y" are independently selected from the group consisting of S, SO$_2$, direct link O, R—C—R or C=O, provided that at least one of "X" and "Y" is a CF$_3$—C—R group, and "R" is CF$_3$, lower alkyl or phenyl, and "n" is a number sufficiently high to provide an inherent viscosity of at least about 0.2 as measured from a 0.5 wt% solution in dimethylacetamide at 25° C.

The novel hydroxy polyamides useful according to the present invention may be prepared by reacting an acid chloride with hexafluoro-2,2-bis (3-amino-4-hydroxyphenyl) propane or its reactive equivalent e.g. hexafluoro-2,2-bis(3-amino-4-methoxyphenyl)- propane wherein the hydroxy group may be replaced by an alkoxy or aryloxy containing up to ten carbon atoms for example, ethoxy, propoxy, butoxy, phenoxy etc. This diamine is used in an amount of from about 20 to 100 mole percent, preferably about 50 mole percent and most preferably about 70 to 100 mole percent of the diamine components present in the polymer, as disclosed more completely in copending application, Ser. No. 915,342, the disclosure of which is hereby incorporated herein by reference thereto.

Such polyamides preferably have the general structure (2):

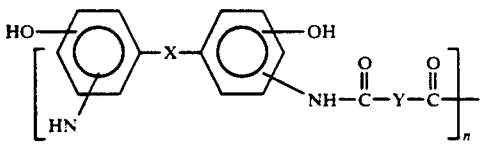

where "X" is selected from the group consisting of S, SO₂, direct link, O, R—C—R or C=O; "Y" is selected from the group consisting of S, SO₂, direct link, phenyl,

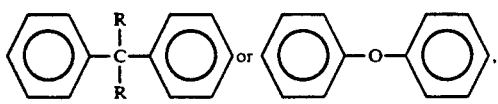

and "R" is CF₃, lower alkyl or phenyl, provided that at least one of either "X" or "Y" is an "R" containing group in which "R" is CF₃ and "n" is as defined for structure (1).

The essence of the present invention resides in the discovery that the present alkali-soluble binder materials can be combined, alone or in combination, with photopolymerizable poly-ethylenically-unsaturated monomers and a photoinitiator to provide negative photoresist coatings which cure rapidly under exposure to actinic radiation including ultraviolet to form an insoluble interpenetrating resinous network in the exposed areas but which are stable and retain their solubility in alkaline developers in unexposed areas. After exposure the masked, non-irradiated areas of the coating can be developed with conventional alkaline developers in a few minutes to provide negative images having a minimum line width of about 4 microns, the image pattern being thermally stable at 300° C. and evidencing no blurring after heating to a temperature of 300° C. for one hour.

DETAILED DESCRIPTION OF PREFERRED EMBODIMENTS

The photosensitive compositions of the invention are useful in many applications such as photopolymerizable varnishes or protective layers such as passivation overcoat films, planarization layers in microelectronic circuits, insulating layers for multi layered hybrid circuits and as photoresists that provide relief structures of good definition on substrates such as silicon chips, polymeric films and metal plates.

The photosensitive compositions of the invention provide polymeric layers or relief structures that possess high thermal and radiation stability, excellent mechanical properties and high insulating properties. These properties make the photosensitive compositions of the invention particularly suited for microelectronic circuit applications. Insulating and mechanical properties are of importance in electronic application to provide for high density circuitry devices that are structurally sound. Thermal and radiation stability are required to withstand the high temperature and radiation environments of modern manufacturing techniques used in the electronic industry. In other applications such as printing plates, the tough mechanical properties of the photopolymerizable compositions of the invention provide a means to make printing plates having the capability of giving long printing runs. In addition, the highly solvent soluble compositions provide the capability of making thick films.

The novel negative-acting, alkali-developable photoresist compositions of the present invention comprise an alkali-soluble hydroxy polyimide preferably having the structure (1), and/or an alkali-soluble hydroxy polyamide preferably having the structure (2) in combination with a light-sensitive polymerization starter, such as 1,3-bis trichloromethyl-5-(p-stilbenyl)-triazine-2,4,5, and a polyethylenically-unsaturated monomer such as a di- or tri-acrylate compound, such as pentaerythritol triacrylate. A small amount of dye may be included to provide color to the coating and to the negative pattern produced therefrom.

A preferred polyimide is one produced by reacting hexafluoro-2,2-bis (3-amino-4-hydroxyphenyl) propane, which is known in the art as 6-F aminophenol, with 5,5'-[2,2,2-trifluoro-1- (trifluoromethyl)ethylidene] bis-1,3-isobenzofurandione (2,2-bis-(3,4-dicarboxyphenyl-hexafluoropropane dianhydride. Such polyimide has the structure (1) in which X and Y are

and "n" is a number sufficiently large to provide an inherent viscosity of at least 0.2 as measured from a solution of the polymer in dimethylacetamide at 25° C. at a polymer concentration of 0.5 weight percent, and is produced according to Example 1 of Ser. No. 76,098.

A preferred polyamide is one produced by reacting the same 6-F aminophenol with a 50/50 mixture of isophthaloyl chloride and terephthaloyl chloride, according to Example 1 of Ser. No. 915,342. The polyamide has the structure (2) in which "X" is a 2,2'hexafluoroisopropylidene group and Y is a phthaloyl radical, preferably an equal molar mixture of isophthaloyl and terephthaloyl radicals and "n" is a number between 150 and 250, most preferably about 200.

The photopolymerizable material of the photosensitive composition of the invention comprises an addition polymerizable, non-gaseous (boiling temperature above 100° C. at normal atmospheric pressure), ethylenically-unsaturated compound containing at least two terminal ethylenic groups, and being capable of forming a high molecular weight polymer by free radical initiated, chain propagating addition polymerization. Suitable polymerizable materials non-exclusively include tetraethylene glycol dimethacrylate, ethylene glycol dimethacrylate, trimethylol propane trimethyacrylate, trimethylol propane triacrylate, polyethylene glycol (200) diacrylate, polyethylene glycol (600) diacrylate, diethylene glycol dimethacrylate, pentaerythritol tetraacrylate, pentaerythritol triacrylacrylate, 1,4-butanediol diacrylate, 1,6-hexanediol dimethacrylate, dipentaerythritol monohydroxypentaacrylate, ethoxylated bisphenol A, dimethacrylate, tripropylene glycol diacrylate, tris(2-hydroxyethyl) isocyanurate, trimethylacrylate tris (2-hydroxyethyl) triacrylate, glycerol diacrylate, glyercoltriacrylate, hexamethylene diamine, diacrylamide and mixtures thereof.

Suitable photoinitiators useful in the practice of the invention are disclosed in U.S. Pat. No. 4,464,457; 4,465,758 and 4,619,998 which are incorporated herein by reference. A large number of substances can be used in the mixture of the present invention as polymerization initiators which can be activated by radiation, particularly actinic light. Examples are benzoin and its derivatives, trichloromethyl-s-triazines, 1,3-bistrichloromethyl-5-(para-biphenyl) triazine-2,4,6; 1,3-bis-trichloromethyl-5-para-stilbenyl) triazine-2,4,6; 1,3-bis-trichloromethyl-5-(4-ethoxy-1-naphthyl)triazine-2,4,6; carbonylmethyleneheterocylic compounds containing trihalomethyl groups, for example 2-(p-trichloromethylbenzoyl methylene)-3-ethyl benzothiazoline, acridine derivatives, for example, 9-phenylacridine, 9-p-methoxyphenylacridine, 9-acetylamino-acridine and benz(1)acridine. Other examples are phenazine derivatives, for example 9,10-dimethylbenz(a)phenazine and 10-methoxybenz(a)phenazine, quinoxaline derivatives, for example, 6,4',4''-trimethoxy-2,3-diphenyl-2.3-diphenylquinoxaline and 4',4''-dimethoxy-2,3-diphenyl-5-azaquinoxaline; 2,3-diphenyl-6-methylquinoxaline-1,4; 2,3-diphenyl-6-methylquinoxaline-1,4; 2,3-bis(para methoxyphenyl)-6-methylquinoxaline-1,4; 2,3-bis(paramethoxyphenyl) qunioxaline-1,4 and quinazoline derivatives. The initiators are generally employed in the present invention in an amount of 0.01 to 2, preferably 0.05 to 10% by weight, relative to the non-volatile components of the mixtures.

The mixture according to the present invention generally contains 20 to 90, preferably 30 to 80, % by weight of the polyamide and/or polyimide and 80 to 10, preferably 70 to 20% by weight of polymerizable compounds, relative in each case to the total amount of non-volatile ethylenically unsaturated monomer and polyamide and/or polyimide.

The mixture can contain, as further conventional components, polymerization inhibitors, oxygen scavengers, hydrogen donors, sensitometric regulators, dyes, pigments, plasticizers and thermally activatable cross-linking agents.

It is generally advantageous to substantially isolate the compositions of the present invention from the influence of atmospheric oxygen during photopolymerization. If the composition is used in the form of a thin copying layer, it is recommended that a suitable cover film with a low permeability to oxygen be applied to the layer.

Leuco bases of triarylmethane dyes that are suitable for use in the present invention include those of Crystal Violet, Victoria Blue BH, Victoria Pure Blue BOH, Methyl Violet, Fuchsine, Malachite Green, Acid Violet 5B, Solar Cyanine 6B, Brillant Green and Acilan Violet S.

Suitable actinic radiation to which the composition according to the present invention is sensitive is any electromagnetic radiation whose energy is sufficient to initiate polymerization. Visible and ultraviolet light, x-rays and electron radiation are particularly suitable. Laser radiation in the visible and UV range can also be used Short-wavelength visible and near-UV light is preferred.

The photosensitive compositions of the invention may be employed in solution which can be applied to a substrate by any conventional method; roller coating, dipping, spraying, whirling and spin coating. They may be prepared into and used as dry films as taught in U.S. Pat. No. 4,469,982 to Celeste, the teachings of which are incorporated herein by reference.

Suitable substrates include silicon, aluminum, glass polymeric resin boards and films, silicon dioxide, doped silicon dioxide, silicon nitride, tantalum, copper, polysilicone ceramics and aluminum/copper mixtures.

Suitable application solvents include toluene, N-methyl-pyrrolidone, dimethylformamide, -butyrolactone, acetone, diglyme, tetrahydrofuran, propylene glycol methyl ether and mixtures. The photosensitive compositions after exposure may be developed by conventional aqueous alkaline developers such as those disclosed in parent applications Ser. No. 76,098 and 915,342.

The following examples are illustrative of the invention:

EXAMPLE 1

The hydroxylated polyimide condensation product of 2,2-bis(3-amino-4-hydroxy-phenyl) hexafluoropropane and 2,2-bis(3,4-dicarboxyphenyl)hexafluoropropane tetracarboxylic dianhydride was prepared according to Example 1 of parent application Ser. No. 76,098.

A photosensitive composition was prepared using the said hydroxylated polyimide. The composition consisted of the following:

| Hydroxylated Polyimide | 2.0 grams |
|---|---|
| Pentaerythritol triacylate (PETA *) | 0.5 grams |
| 1,3-bistrichloromethyl-5-(p-stilbenyl) triazine-2,4,6 | 0.1 gram |
| Dye | 0.03 gram |
| γ-Butyrolactone | 11.0 grams |
| Propylene glycol methyl ether (PGME) | 9.0 grams |

* Commercially available PETA comprising a mixture of pentaerythritol triacrylate and pentaerythritol diacrylate.

The above ingredients dissolved to form a clear solution with the polyimide exhibiting excellent compatibility with the other components in the composition.

The resulting photosensitive composition was filtered under pressure and roller coated on an anodized aluminum plate. The coated plate was pre-baked at 90° C. for 3 minutes to obtain a resist film having thickness of 4–5 microns. The film was then overcoated with polyvinyl alcohol protective layer (10% in water) pre-baked at 90° C. for 2 minutes. The film was then covered with a photomask having a striped pattern so that the film and the photomask were in tight contact. The film was exposed through an Addalux vacuum printer (2KW, photopolymer lamp/UV broad band radiation). The irradiation time range was between 150 and 300 sec. After the irradiation, the coating was first rinsed with water to remove the polyvinyl alcohol overcoat, then was developed with a mixture of AZ-developer and water or isopropanol to give a negative image having a line and space pattern having a minimum line width of 4 microns. The pattern thus obtained is thermally stable at 300° C. and no blurring was noticed on heating the plate at 300° C./1 hr.

EXAMPLE 2

The hydroxylated polyamide of the following formula was according to Example 1 of parent application Ser. No. 15,347:

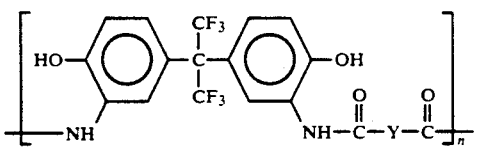

where Y=50/50 equal molar mixture of isophthaloyl/-terephthaloyl radicals and n was approximately 200, by reacting hexafluoro-2,2-bis (3-amino-4-hydroxyphenyl) propane with a 50/50 mixture of isophthaloyl chloride and terephthaloyl chloride.

A photoresist solution was prepared by dissolving 2 parts by weight of the hydroxylated polyamide, 0.5 parts pentaerythritol triacrylate, 0.1 part (1,3, bistri-chloromethyl-5-(p-stilbenyl)-triazine-2,4,6) and 0.03 parts by weight of red dye in 11 parts by weight of butyrolactone and 9.0 parts by weight of propylene glycol methyl ether. The solution was filtered and then roller coated on an anodized aluminum plate. After drying for 3 minutes at 90° C., a resist film having thickness of 2-3 um was obtained. This film was coated with a protective layer of polyvinyl alcohol and then covered with a photomask having a stripped pattern so that the film and the photomask were in tight contact. Then UV light was irradiated thereon for 150 seconds by the use of an Addalux printer. After the irradiation, the coating was rinsed with water to remove the polyvinyl alcohol and then developed for 150 seconds using 1:5 alkaline developer (AZ Developer): water mixture. The developed plate was washed with water to obtain good negative image pattern having a minimum line width of 4 microns. The developed pattern was thermally stable at 300° C. The pattern obtained showed no blurring or loss of resolution after heating for one hour at a temperature of 300° C.

Additional photoresist compositions were prepared and coated exactly according to Example 2 from hydroxylated polyamides produced by reacting the amino phenol compound thereof with (a) hexafluoro-2,2 bis (4-carboxyphenyl) propane and with (b) hexafluoro-2,2-bis (3-carboxyphenyl) propane. In each case the coatings were image-masked and exposed for 300 seconds in the manner disclosed in Example 2 and then developed for 120 seconds to provide negative image patterns. The negative image patterns resulting from the use of monomer (a) were as good as those of Example 2. The negative image patterns resulting from the use of monomer (b) were better than those of Example 2.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

We claim:

1. A negative-acting aqueous base-developable photoresist composition comprising (1) at least one base-soluble hydroxylated aromatic polyimide and/or polyamide resinous binder material containing substituents carrying fluoroalkane groups; (2) at least one photopolymerizable material having at least two ethylenically-unsaturated double bonds, and (3) a light sensitive polymerization initiator, said composition curing rapidly upon exposure to actinic radiation, to form a base-insoluble interpenetrating network in exposed areas and a base-soluble resinous network in unexposed areas whereby development of the unexposed photoresist layer with conventional alkaline developers provides negative pattern images having a minimum line width of about 4 microns, and being thermally stable at about 300° C.

2. The composition according to claim 1 wherein said binder material is a polyimide of the formula:

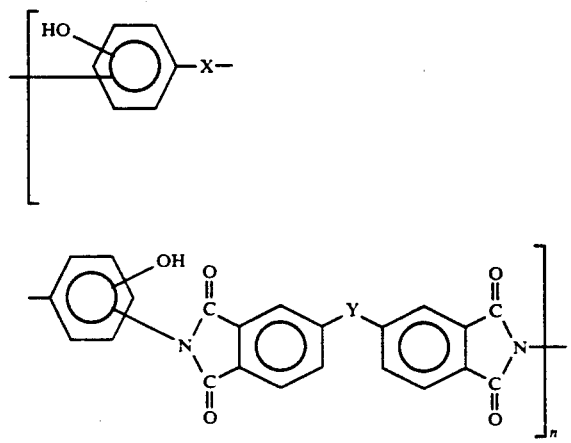

where both X and Y are independently selected from the group consisting of S, SO₂, direct link, O, R—C—R or C=O, provided that at least one of X and Y is a CF₃—C—R group, and R is CF₃, lower alkyl or phenyl, and n is a number sufficiently high to provide an inherent viscosity of at least 0.2 as measured from a 0.5 wt% solution in dimethylacetamide at 25° C.

3. A composition according to claim 2, wherein both X and Y are 2,2'-hexafluoroisopropylidene groups, and n is a number sufficiently high to provide an inherent viscosity of at least 0.2 as measured from a 0.5 wt% solution in dimethylacetamide at 25° C.

4. A composition according to claim 2 or 3, comprising said polyimide binder material, a poly(meth)acrylic monomer and a light sensitive photoinitiator.

5. A composition according to claim 4, wherein said monomer is pentaerythritol triacrylate.

6. A composition according to claim 1, wherein said binder material is a polyamide of the formula:

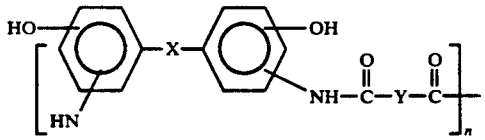

where X is selected from the group consisting of S, SO₂, direct link, O, R—C—R, or C=O; Y is selected from the group consisting of S, SO₂, phenyl,

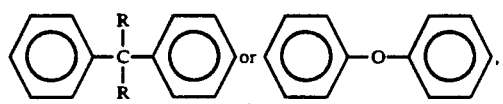

and R is CF₃, lower alkyl, or phenyl, provided that at least one of either X or Y is an R containing group in which R is CF₃, and n is a number sufficiently high to provide an inherent viscosity of at least 0.2 as measured form a 0.5 wt% solution in dimethylacetamide at 25° C.

7. A composition according to claim 6, wherein said polyamide is one in which X is a 2,2'-hexafluoroisopropylidene group and Y is a phthaloyl group, and n is a number between 150 and 240.

8. A composition according to claim 7, wherein Y is an equimolar mixture of isophthaloyl and terephthaloyl groups and n is approximately 200.

9. A composition according to claim 6 comprising said binder material, a poly(meth)acrylic monomer and a light sensitive photoinitiator.

10. A composition according to claim 9, wherein said monomer comprises pentaerythritol triacrylate.

* * * * *